(12) United States Patent
Habara et al.

(10) Patent No.: US 7,132,830 B2
(45) Date of Patent: Nov. 7, 2006

(54) RADIOFREQUENCY WAVE TRANSMISSION CIRCUIT USING ARBITRARY WAVEFORM GENERATOR AND NMR APPARATUS USING THE SAME

(75) Inventors: Hideta Habara, Mito (JP); Minseok Park, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/058,356

(22) Filed: Feb. 16, 2005

(65) Prior Publication Data

US 2005/0206384 A1 Sep. 22, 2005

(30) Foreign Application Priority Data

Mar. 22, 2004 (JP) .............................. 2004-082535

(51) Int. Cl.
*G01V 3/00* (2006.01)
(52) U.S. Cl. ....................................... 324/318; 324/322
(58) Field of Classification Search ................ 234/318, 234/322, 309, 307, 320, 319, 300; 375/200, 375/298; 370/208
See application file for complete search history.

(56) References Cited

U.S. PATENT DOCUMENTS

| | | | | |
|---|---|---|---|---|
| 5,457,386 A | * | 10/1995 | Matsunaga et al. | 324/318 |
| 5,909,460 A | * | 6/1999 | Dent | 375/130 |
| 6,259,747 B1 | * | 7/2001 | Gustafsson et al. | 375/298 |
| 6,504,505 B1 | * | 1/2003 | Yung | 342/374 |
| 6,515,622 B1 | * | 2/2003 | Izadpanah et al. | 342/368 |
| 6,600,795 B1 | * | 7/2003 | Ohta et al. | 375/343 |
| 6,980,509 B1 | * | 12/2005 | Okada et al. | 370/208 |
| 2004/0196925 A1 | * | 10/2004 | Moore et al. | 375/308 |

OTHER PUBLICATIONS

"Radio Frequency Signal Processing With A Monolithic Four-Quadrant Multiplier", Miroslav Kasal and Ivan Hruby, pp. 2810-2815 (1991).

* cited by examiner

*Primary Examiner*—Brij B. Shrivastav
(74) *Attorney, Agent, or Firm*—Antonelli, Terry, Stout and Kraus, LLP.

(57) ABSTRACT

An NMR apparatus has a circuit adapted to improve the degree freedom of design and generate an excitation radiofrequency wave pulse suited for a sample to be measured. The radiofrequency wave transmission circuit includes a local oscillator, an IQ modulator having two mixers and two arbitrary waveform generators connected to the IQ modulator. Fourier inverse transform is applied to data inputted to the arbitrary waveform generators.

18 Claims, 5 Drawing Sheets

DATA GENERATION PROCESS

RADIOFREQUENCY WAVE TRANSMISSION CIRCUIT USING ARBITRARY WAVEFORM GENERATOR AND NMR APPARATUS USING THE SAME

BACKGROUND OF THE INVENTION

The present invention relates to an NMR apparatus having a radiofrequency wave transmission circuit.

Generally, in a nuclear magnetic resonance (hereinafter referred to as NMR) measuring apparatus, a radiofrequency wave is shaped into a pulse having a width of several microseconds and the pulse is irradiated on a sample, so that the level of a nuclear spin in the sample can be excited and a free induction decay signal from the nuclear spin can be received. Conventionally, when exciting the sample by selectively applying a frequency range to it, an excitation pulse is obtained by changing the phase and the amplitude of a pure sine wave independently of each other in a unit of several tens of nanoseconds.

In the NMR measuring apparatus, excitation frequencies in a wide range spreading around a single frequency need to be generated. In this connection, a method called MREV or WALTZ for finely changing only the phase and a method such as E-BURP for changing the amplitude have hitherto been realized. On the other hand, for creation of an adiabatic pulse, a pulse creation method such as CHIRP or WURST has been developed.

Further, a method using a modulator of IQ type in a radiofrequency wave transmission system of NMR measuring apparatus is described in Review of the Science Instruments, 62(11), pp. 2810–2815, 1991.

SUMMARY OF THE INVENTION

As the technological development of magnets advances and the intensity of a magnetic field of an NMR measuring apparatus increases, there results an advantage that confers improved sensitivity upon the user. With the magnetic field intensity increased, necessary power of the radiofrequency pulse so increases as to excessively increase energy applied to the sample, resulting in a problem that the temperature of the sample is raised.

Especially when a pulse for decoupling frequencies in a wide range is irradiated, an increase in temperature of the sample matters. To avoid this problem, a method is available according to which incident power is reduced or the pulse duration is shortened but the method has both merits and demerits. Recently, an adiabatic pulse such as CHIRP or WURST has come on and a technique of decoupling spectra at frequencies in a wide range while keeping the temperature of sample from rising has been developed.

The term "decoupling" referred to herein means releasing coupling. In general, a spectrum measured through NMR is split slightly by several Hz under the influence of other nuclei residing near an atomic nucleus radiating the spectrum. These split spectra are termed coupled spectra. For decoupling, a radiofrequency wave pulse is irradiated, thereby ensuring that coupling can be destroyed and a spectrum at the associated portion can be unified.

In the conventional method as above, only the phase and amplitude of a pure sine wave are controlled at time intervals of 100 nanoseconds or more to create a waveform of CHIRP type and eventually, an ideal CHIRP waveform is merely imitated. Further, whether a program of a pulse waveform practically prepared by a user runs well or not cannot be comprehended in many cases unless simulation is carried out by solving the Bloch equation.

In addition, the conventional method for finely modulating only the phase and amplitude can afford to excite the neighborhood of a single frequency but in the method, very difficult working is required to form a pulse train adapted for selectively exciting and decoupling two or three frequency ranges.

An object of this invention is to further increase the degree of freedom of selective excitation. If the user can afford to freely program selective excitation frequencies, an excitation pulse most suited for a sample to be measured can be set freely. As a result, the temperature of the sample can be prevented from rising and spectra can be fetched efficiently. Also, an efficient excitation pulse matching a spectral pattern radiating from the sample can be designed freely.

According to an embodiment of the invention, a radiofrequency wave transmission circuit for nuclear magnetic resonance comprises a local oscillator, two arbitrary waveform generators for generating output waveforms on the basis of inputted data, respectively, and an IQ modulator having two mixers and being supplied with an output of the local oscillator and the outputs of the two arbitrary waveform generators, wherein the IQ modulator modulates an electromagnetic wave from the local oscillator with the output waveforms of the two arbitrary waveform generators.

According to the present invention, the degree of freedom of designing the radiofrequency wave transmission pulse for the NMR apparatus can be improved drastically.

Other objects, features and advantages of the invention will become apparent from the following description of the embodiments of the invention taken in conjunction with the accompanying drawings.

DESCRIPTION OF THE EMBODIMENTS

Figure 1:
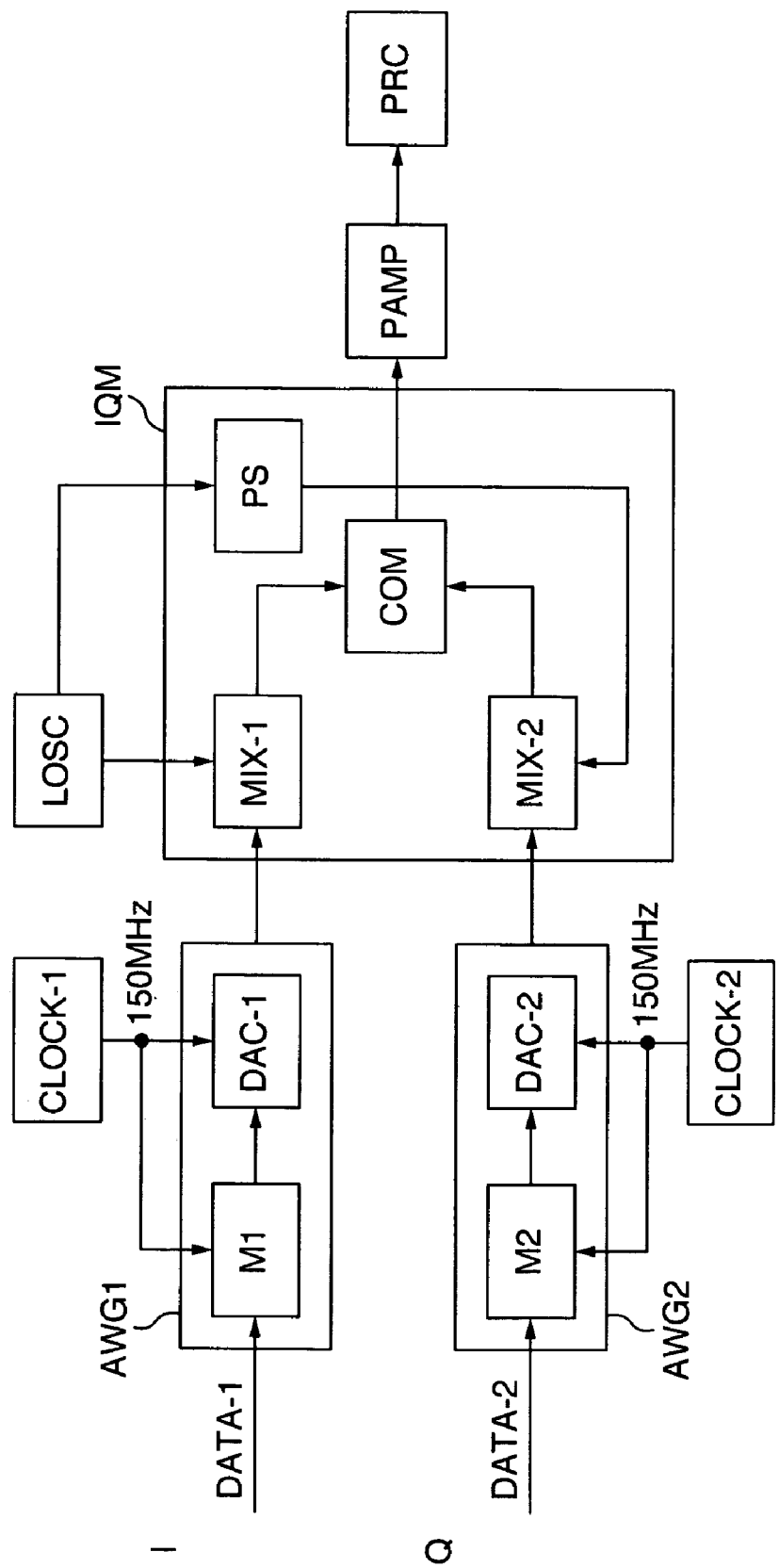
FIG. 1 is a block diagram of a radiofrequency wave transmission circuit using arbitrary waveform generators (AWG's) according to an embodiment of the invention.

Referring now to FIG. 1, there is illustrated, in block diagram form, an embodiment of this invention. The data of DATA-1 and DATA-2 generated by using a computer, for instance, are inputted to two arbitrary waveform generators AWG1 and AWG2, respectively, and are once stored in memories M1 and M2. For example, these data are stored in synchronism with reference clocks CLOCK-1 and CLOCK-2 of about 150 MHz.

The stored data are subjected to digital to analog conversion by means of digital to analog converters DAC-1 and DAC-2 and delivered in the form of electrical voltages. These output voltages are applied to an IQ modulator IQM. The maximum frequency generated by the arbitrary waveform generators AWG1 and AWG2 depend on the clock, amounting up to, for example, several MHz.

Figure 2:
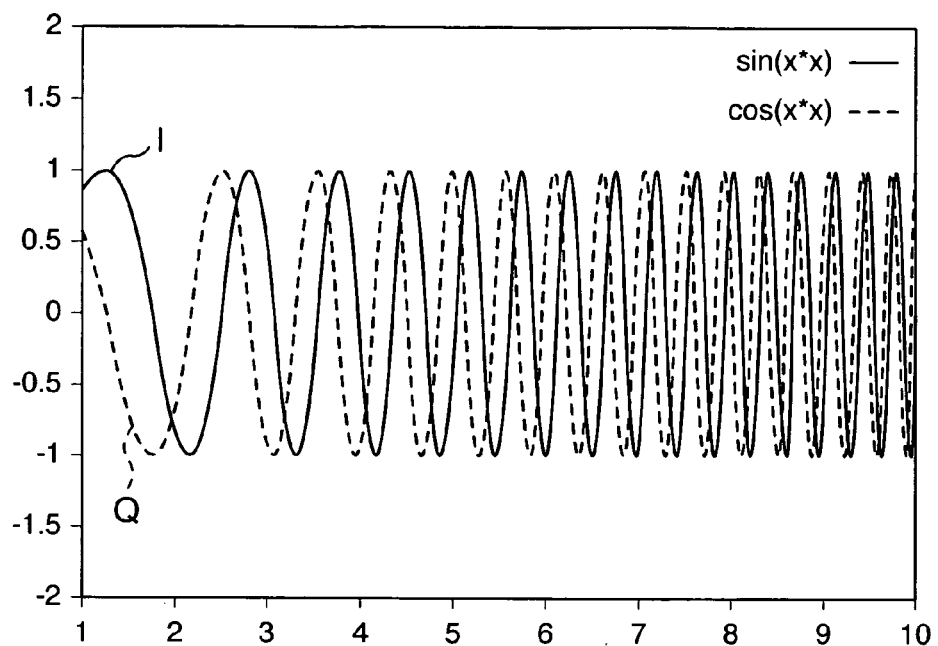
FIG. 2 is a waveform diagram showing an example of outputs of the arbitrary waveform generators.
Figure 3:
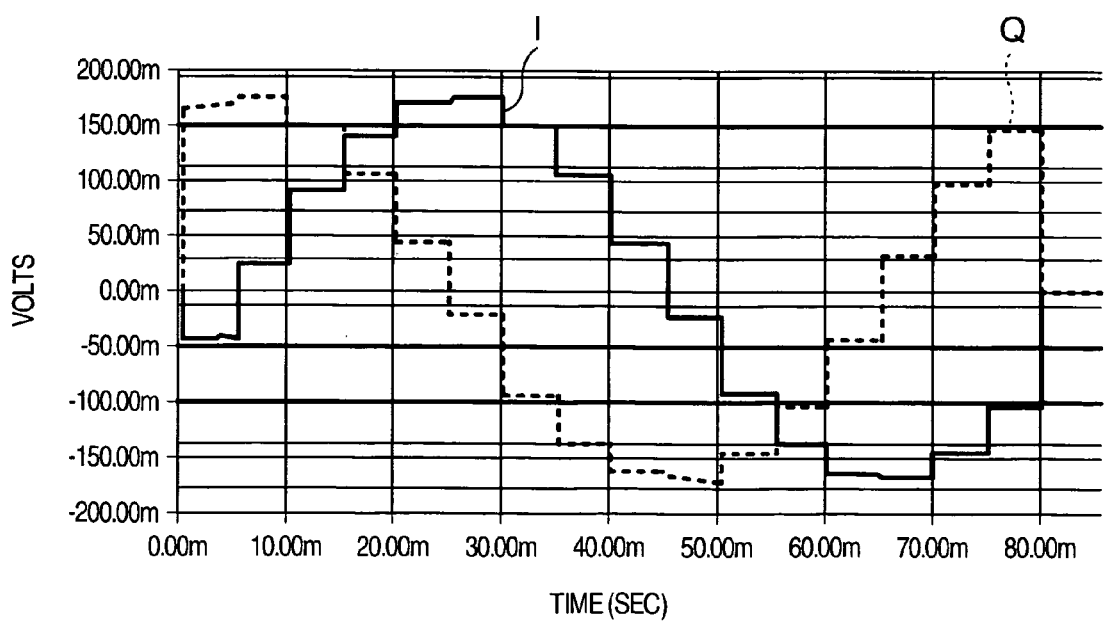
FIG. 3 is a diagram useful to explain waveforms generated in the arbitrary waveform generators.

An example of the output waveforms of the two arbitrary waveform generators AWG1 and AWG2 are graphically depicted in FIG. 2. Waveforms I and Q represent the output waveforms of the arbitrary waveform generators AWG1 and AWG2, respectively, with the waveform I indicating a real part and the waveform Q indicating an imaginary part. The continuous waves I and Q which are mutually dephased can be formed by temporally changing DC voltages as shown in FIG. 3. In this embodiment, the phase changes by 360° every 22.5°.

A local oscillator LOSC oscillates a center frequency acting as a reference in NMR measurement, for example, 600 MHz. The outputs of two arbitrary waveform generators AWG1 and AWG2 and the output of local oscillator LOSC are modulated using the IQ modulator IQM. A modulated output from the IQ modulator IQM is amplified by a power amplifier PAMP and then supplied to a probe PRC of a nuclear magnetic resonance apparatus.

Specifically, the IQ modulator IQM is sold by MITEQ corporation or MINI-CIRCUITS corporation in USA. Most of products of these corporations are, however, dedicated to a specified frequency of 10 MHz or 20 MHz and in order for the products to be used for a frequency for NMR (600 MHz or 800 MHz), the phase correction compensation circuits must be stabilized. Generally, in the NMR apparatus, it is preferable that from the standpoint of frequency purity, a spectrum peak of so-called spurious noise should have a level of −30 dB or less in relation to a spectrum of a main peak. A normal IQ modulator has a spurious versus main peak ratio of −20 dB. In the present embodiment, an IQ modulator having a spurious noise of −30 dB or less is used.

The IQ modulator IQM includes two mixers MIX-1 and MIX-2, a phase shifter PS for branching the signal from the local oscillator LOSC and shifting the phase of one signal by 90° and a coupler COM for coupling outputs of the two mixers MIX-1 and MIX-2. The outputs from the arbitrary waveform generators AWG1 and AWG2 are inputted to the mixers MIX-1 and MIX-2, respectively. The output waveform of the local oscillator LOSC, for example, an electromagnetic wave of several of hundreds of MHz is modulated by each of the mixers MIX-1 and MIX-2. The two modulated electromagnetic waves are coupled with each other by means of the coupler COM so as to provide an output waveform.

The phase shifter PS is provided in the IQ modulator IQM to create the waveform which is 90° shifted from the carrier. In making the phase shifter PS in an analog fashion, the phase shifter must be so formed as to match a certain fixed frequency. This is because the phase shifter PS is sensitive to the frequency of the carrier.

When suitable signals from the arbitrary waveform generators AWG1 and AWG2 are inputted to the IQ modulator IQM, the IQ modulator functions as a single sideband mixer (SSB mixer). The single sideband mixer is also called an image rejection mixer and when mixing two frequencies f1 and f2 (f1>f2), this type of mixer delivers only a frequency of f1+f2 or a frequency of f1−f2.

In case only the frequency f1+f2 is delivered, a signal at frequency f1−f2 is called an image. The ratio of intensity of signal at frequency f1−f2 to that of signal at f1+f2 is called a signal suppression ratio and the performance of the SSB mixer is better when the suppression of image signal is better. For example, −20 dB or less is needed.

Figure 4A:
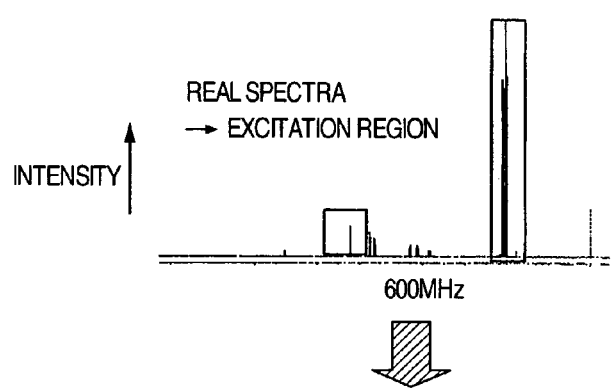
FIGS. 4A to 4E are diagrams for explaining data generation using Fourier inverse transform.
Figure 4B:
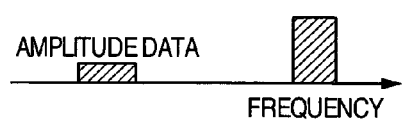
Figure 4C:
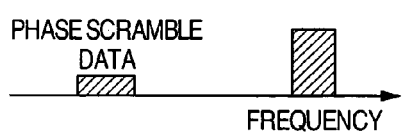
Figure 4D:
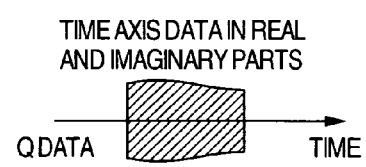
Figure 4E:
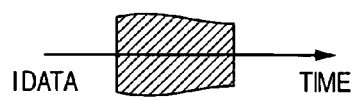

Referring now to FIGS. 4A to 4E and FIG. 5, a process will be described through which the user can form an excitation pulse freely. Illustrated in FIG. 4A is an actual NMR spectral signal. It is now considered that portions of the spectral signal, that is, only two portions enclosed by rectangular frame are desired to be excited. Amplitude data corresponding to portions on frequency axis desired to be excited are extracted in the form of a rectangle.

With phase data matching the rectangular amplitude information set to a certain constant value, the dynamic range becomes very large when the data is subjected to Fourier inverse transform so as to be converted into temporal data. Accordingly, a phase scramble process is undertaken. In NMR measurement, for the purpose of suppressing a highly intensive signal due to water which adversely interferes with detection of a weak signal, there is a demand for continuously irradiating a specified frequency band.

In that case, by not irradiating a frequency of constant phase but irradiating a frequency while scrambling its phase randomly (mingling), the amplitude of a transmission waveform becomes constant and stable irradiation can be ensured. This operation is called a phase scramble operation.

When a section of from frequency f1 to frequency f2 is desired to be irradiated using the phase scramble method, amplitude A is defined as $A(f)=1$ for $f1 \leq f \leq f2$ $A(f)=0$ for $f<f1$ or $f>f2$ and the phase is subjected to N partition and scrambled, so that phase P can be expressed as follows.

$P(f)=2\pi^{*}\text{random}(k)(f1+k^{*}(f2-f1)/N \leq f \leq f1+(k+1)^{*}(f2-f1)/N, k=1\ldots N)$ where random (k) represents a random number taking a real number between 0 and 1 at seed integer k. By using A(f) and P(f), a spectrum S(f) for excitation in the frequency range can be expressed by a complex number and $S(f)=A(f)\exp(iP(f))$ stands.

Figure 5:
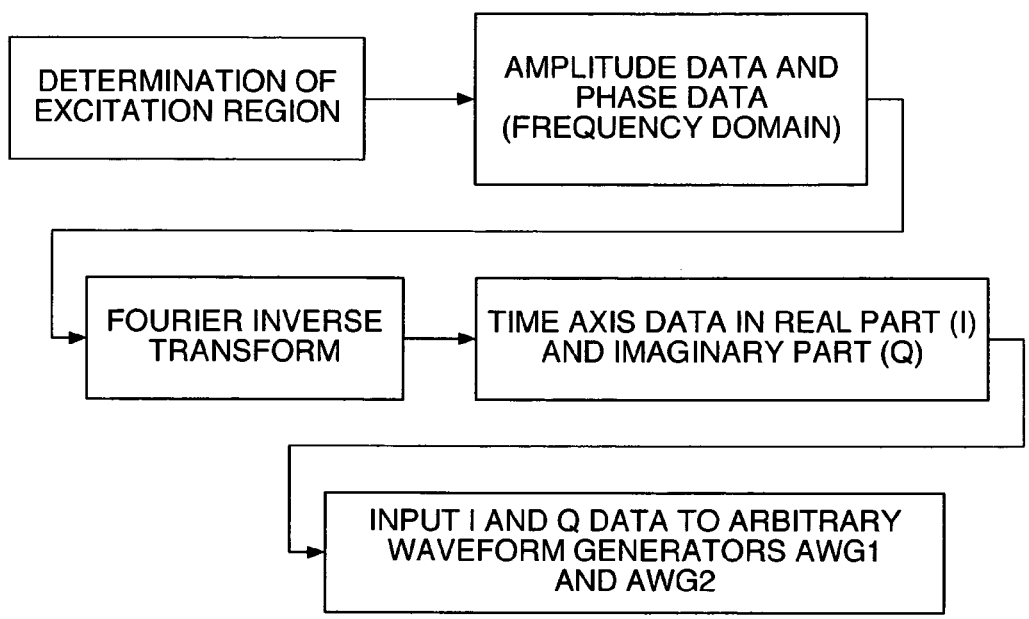
FIG. 5 is a flowchart of data generation using Fourier inverse transform.

The flow explained in connection with FIGS. 4A to 4E can be paraphrased by using a block diagram of FIG. 5. The thus obtained frequency data of amplitude and phase is subjected to Fourier inverse transform so as to be converted into real number data and imaginary number data on time axis. Conversion of data from time axis to frequency axis is called Fourier forward transform and conversely, conversion of data from frequency axis to time axis is called Fourier inverse transform.

The aforementioned spectrum S(f) for excitation is subjected to Fourier inverse transform to create complex data W(t) on time region as below.

$W(t)=\int S(f)\exp(ift)df$

When W(t) is obtained, I data formed by the arbitrary waveform generator AWG1 and Q data formed by the arbitrary waveform generator AWG2 correspond to real part and imaginary part of the W(t), respectively, and can be expressed by the following equations.

$I(t)=\text{Real}(W(t)), Q(t)=\text{Img}(W(t))$

Accordingly, it is necessary for the arbitrary waveform generators AWG1 and AWG2 to generate the data as above. Then, the thus obtained data are used as input data to the arbitrary waveform generators AWG1 and AWG2. Through the above process, the user can produce an excitation pulse freely.

An example of method for generation of data to be inputted to the arbitrary waveform generators AWG1 and AWG2 has been described with reference to FIGS. 4A to 4E and FIG. 5 but another method for generation of input data may be conceived. The actual spectrum data as shown in FIG. 4A is obtained by subjecting a free induction decay signal (FID) on time axis to Fourier transform.

Figure 6:
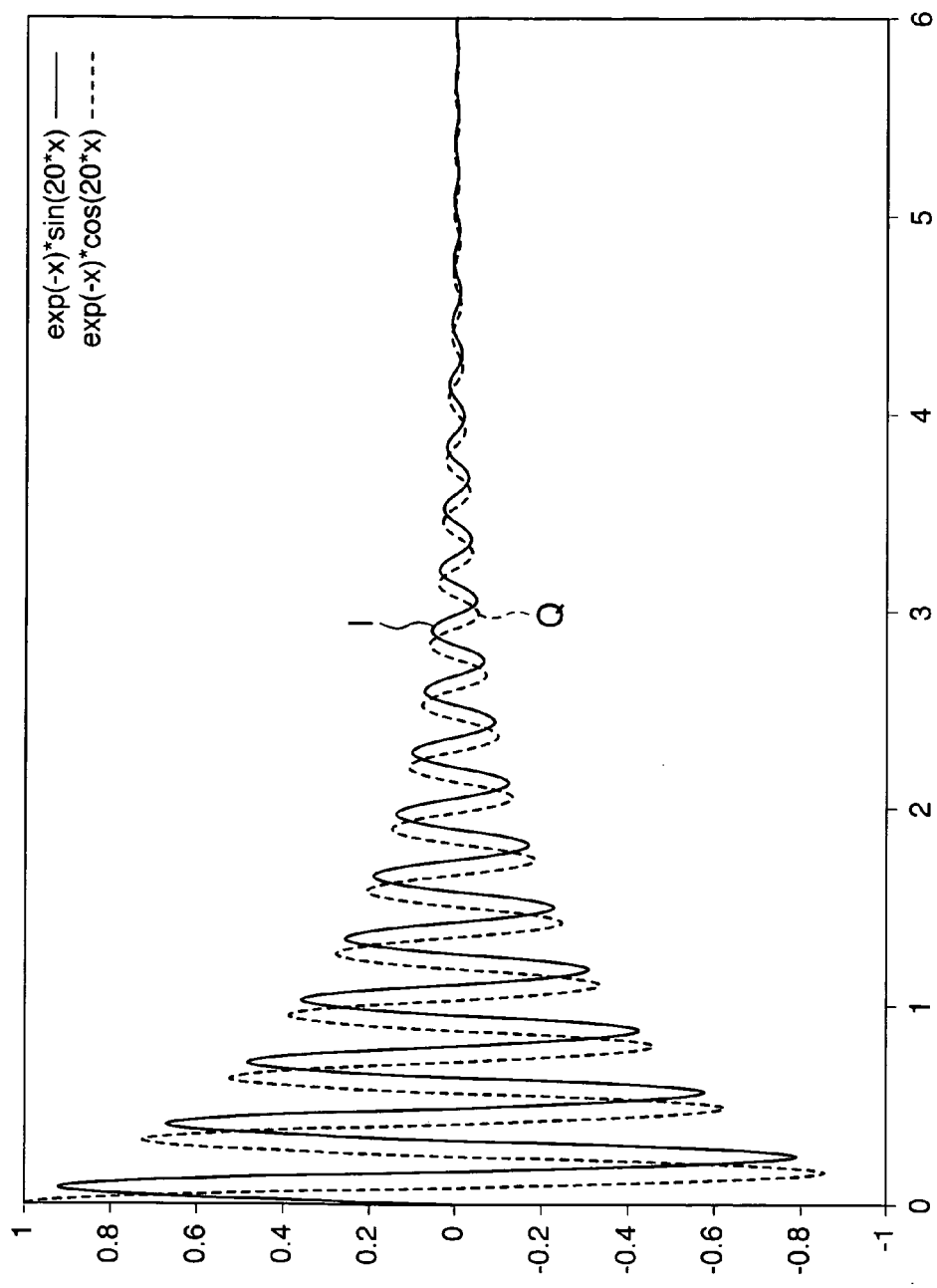
FIG. 6 is a graphic representation showing an example of free induction decay signals.

The FID signal is used as input data by employing it without alteration or thinning it out. The FID is short for free induction decay and this is named after the fact that generally, a signal observed through NMR is intensive initially and is gradually decayed. Specifically, the FID signal takes such a waveform as defined by a function as $F(x)=\exp(-t)\sin(wt)$. An example of this function is graphically illustrated in FIG. 6.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A radiofrequency wave transmission circuit for nuclear magnetic resonance comprising:
   a local oscillator;
   two arbitrary waveform generators for generating output waveforms on the basis of inputted data, respectively;
   said output waveforms being continuous waveforms formed by temporally converting said data to a DC voltage; and
   an IQ modulator supplied with an output of said local oscillator and said output waveforms of said two arbitrary waveform generators for modulating said output from said local oscillator with said output waveforms from said two arbitrary waveform generators.

2. A radiofrequency wave transmission circuit according to claim 1, wherein said IQ modulator includes two mixers, a phase shifter for 90 degree shifting the phase of the electromagnetic wave from said local oscillator and a coupler for coupling and delivering outputs of said two mixers, one of said mixers being inputted with the output of said local oscillator and the other being inputted with the output of said phase shifter.

3. A radiofrequency wave transmission circuit according to claim 1, wherein said arbitrary waveform generators are inputted with digital data, said digital data being once stored in memories and then converted into analog data by means of digital to analog converters in synchronism with clocks so as to be delivered.

4. A radiofrequency wave transmission circuit according to claim 1, wherein as the data inputted to said arbitrary waveform generators, data subjected to Fourier inverse transform are used.

5. A radiofrequency wave transmission circuit according to claim 2, wherein as the data inputted to said arbitrary waveform generators, data subjected to Fourier inverse transform are used.

6. A radiofrequency wave transmission circuit according to claim 3, wherein as the data inputted to said arbitrary waveform generators, data subjected to Fourier inverse transform are used.

7. A radiofrequency wave transmission circuit according to claim 4, wherein as source data of the data subjected to Fourier inverse transform, data formed by making reference to an actual spectrum of a measured sample or data formed by processing said actual spectrum are used.

8. A radiofrequency wave transmission circuit according to claim 5, wherein as source data of the data subjected to Fourier inverse transform, data formed by making reference to an actual spectrum of a measured sample or data formed by processing said actual spectrum are used.

9. A radiofrequency wave transmission circuit according to claim 6, wherein as source data of the data subjected to Fourier inverse transform, data formed by making reference to an actual spectrum of a measured sample or data formed by processing said actual spectrum are used.

10. An NMR apparatus comprising a probe coil supplied with the output of said radiofrequency wave transmission circuit as recited in claim 1.

11. An NMR apparatus comprising a probe coil supplied with the output of said radiofrequency wave transmission circuit as recited in claim 2.

12. An NMR apparatus comprising a probe coil supplied with the output of said radiofrequency wave transmission circuit as recited in claim 3.

13. An NMR apparatus comprising a probe coil supplied with the output of said radiofrequency wave transmission circuit as recited in claim 4.

14. An NMR apparatus comprising a probe coil supplied with the output of said radiofrequency wave transmission circuit as recited in claim 5.

15. An NMR apparatus comprising a probe coil supplied with the output of said radiofrequency wave transmission circuit as recited in claim 6.

16. An NMR apparatus comprising a probe coil supplied with the output of said radiofrequency wave transmission circuit as recited in claim 7.

17. An NMR apparatus comprising a probe coil supplied with the output of said radiofrequency wave transmission circuit as recited in claim 8.

18. An NMR apparatus comprising a probe coil supplied with the output of said radiofrequency wave transmission circuit as recited in claim 9.

* * * * *